(12) United States Patent
Okita et al.

(10) Patent No.: US 11,189,480 B2
(45) Date of Patent: Nov. 30, 2021

(54) ELEMENT CHIP MANUFACTURING METHOD

(71) Applicant: Panasonic Intellectual Property Management Co., Ltd., Osaka (JP)

(72) Inventors: Shogo Okita, Hyogo (JP); Atsushi Harikai, Osaka (JP); Akihiro Itou, Kyoto (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 16/809,755

(22) Filed: Mar. 5, 2020

(65) Prior Publication Data
US 2020/0294791 A1    Sep. 17, 2020

(30) Foreign Application Priority Data
Mar. 14, 2019    (JP) .............................. JP2019-047429

(51) Int. Cl.
| | | |
|---|---|---|
| H01L 21/00 | (2006.01) | |
| H01L 21/02 | (2006.01) | |
| H01L 21/78 | (2006.01) | |
| H01L 21/463 | (2006.01) | |
| H01L 21/82 | (2006.01) | |

(52) U.S. Cl.
CPC ...... *H01L 21/02049* (2013.01); *H01L 21/463* (2013.01); *H01L 21/78* (2013.01); *H01L 21/82* (2013.01)

(58) Field of Classification Search
None
See application file for complete search history.

(56) References Cited

U.S. PATENT DOCUMENTS

2010/0129984 A1 * 5/2010 Vakanas ............... B23K 26/082
                                                              438/463
2018/0012802 A1 * 1/2018 Okita .................. H01L 21/3086

FOREIGN PATENT DOCUMENTS

JP          2008-053417 A      3/2008

* cited by examiner

*Primary Examiner* — Reema Patel
(74) *Attorney, Agent, or Firm* — Pearne & Gordon LLP

(57) ABSTRACT

An element chip manufacturing method including: a preparing step of preparing a substrate including a plurality of element regions and a dicing region defining the element regions, the substrate having a first surface and a second surface opposite the first surface; a laser scribing step of applying a laser beam to the dicing region from a side of the first surface, to form a groove corresponding to the dicing region and being shallower than a thickness of the substrate; a cleaning step of exposing the first surface of the substrate to a first plasma, to remove debris on the groove; and a dicing step of exposing the substrate at a bottom of the groove to a second plasma after the cleaning step, to dice the substrate into element chips including the element regions. The first plasma is generated from a process gas containing a carbon oxide gas.

5 Claims, 25 Drawing Sheets

ELEMENT CHIP MANUFACTURING METHOD

CROSS REFERENCE TO RELATED APPLICATION

The present application is based on and claims priority under 35 U.S.C. § 119 with respect to the Japanese Patent Application No. 2019-047429 filed on Mar. 14, 2019, of which entire content is incorporated herein by reference into the present application.

TECHNICAL FIELD

The present invention relates to an element chip manufacturing method, specifically to an element chip manufacturing method including a laser scribing step and a plasma dicing step.

BACKGROUND

Element chips are manufactured by dicing a substrate including a semiconductor layer, a wiring layer, and a protective film. The substrate typically includes a plurality of element regions and a plurality of dicing regions (streets) defining the element regions. Removing the dicing regions separates the substrate into individual element chips.

One recent proposal suggests scribing using a laser beam (laser scribe processing) a part of each dicing region (mainly, the wiring layer and the protective film), and then etching using a plasma the remaining part of each dicing region (mainly, the semiconductor layer). In the laser scribe processing, a pulsed laser beam is typically used to reduce thermal impact. It has been known that, in a laser processing using a pulsed laser beam, abrasion causes piece of material to scatter from the surface of a processing object, and the scattered material lands on and adheres to the same surface in the form of particulates called debris. The process gas used for generating a plasma and the plasma generation conditions vary according to the material, thickness, and other particulars of an object to be processed. The debris having adhered onto the dicing regions in the laser scribe processing, therefore, greatly influences the processing quality of the etching using a plasma.

In this regard, Patent Document 1 (JP 2008-53417A) suggests a cleaning by plasma etching using oxygen gas or a mixed gas mainly composed of oxygen be carried out after the laser scribe processing and before plasma dicing.

In the dicing regions, however, an electrically insulating film, such as $SiO_2$ and/or a metal material, such as TEG (Test Element Group) or metal wiring line is typically disposed between the semiconductor layer and the protective film. In the case where the insulating film and/or the metal material is disposed, the cleaning with a plasma of oxygen gas or a mixed gas mainly composed of oxygen (hereinafter, oxygen plasma) is not sufficient for improving the processing quality of the plasma dicing that follows.

SUMMARY

One aspect of the present invention relates to an element chip manufacturing method including: a preparing step of preparing a substrate including a plurality of element regions and a dicing region defining the element regions, the substrate having a first surface and a second surface opposite the first surface; a laser scribing step of applying a laser beam to the dicing region from a side of the first surface, to form a groove corresponding to the dicing region and being shallower than a thickness of the substrate; a cleaning step of exposing the first surface of the substrate to a first plasma, to remove debris on the groove; and a dicing step of exposing the substrate at a bottom of the groove to a second plasma after the cleaning step, to dice the substrate into element chips including the element regions. The first plasma is generated from a process gas containing a carbon oxide gas.

According to the present invention, desired element chips can be obtained with high quality.

DETAILED DESCRIPTION

Figure 1A:
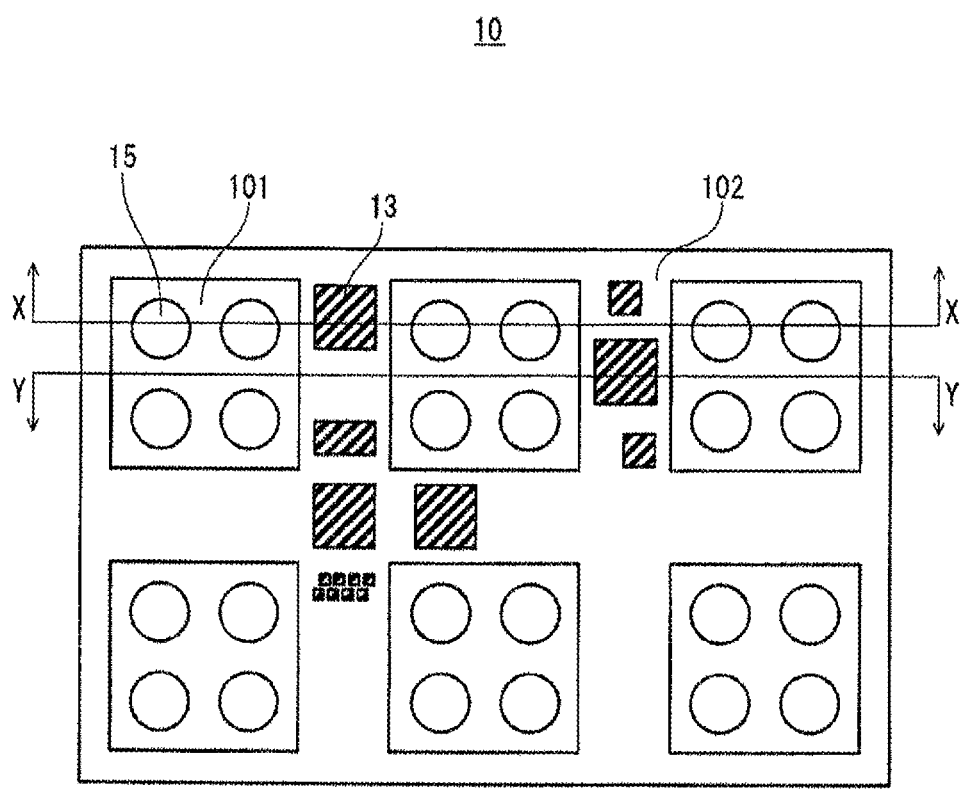
FIG. 1A is a schematic top view of an exemplary substrate.

In the laser scribe processing, in addition to the occurrence of debris, resulting from the difference in thickness of the protective films covering the dicing regions, the presence or absence of the metal material and the insulating film, the difference in size of the metal materials, the difference in thickness of the insulating films, and others, the bottom of the groove is sometimes roughened, or the depth of the groove sometimes differs between the dicing regions. This causes variations in the amount of an object to be removed by the plasma dicing.

When there is a step on the surface of the element region due to an electrode structure like a bump or Cu pillar, in forming a protective film by applying its material onto the substrate, the material is attracted by surface tension toward the step. Therefore, the resultant protective film tends to be thin around the step. For example, the protective film at a dicing region between element regions each having a step around its peripheral edge tends to be thinner than that at a dicing region between element regions both having no step around its peripheral edge. In a place where the protective film is thin, since the energy loss due to absorption into the protective film of the laser beam is small, the groove formed after the laser scribe processing tends to be deep or wide.

When the dicing region includes a metal material, especially, a metal material containing aluminum, much debris is produced by the laser scribe processing in an area where the metal material is disposed (metal containing area). Furthermore, in the metal containing area, much of the laser energy is consumed to ablate the metal material, and thus, the underlying semiconductor layer is unlikely to be ablated. As a result, in the metal containing area, the groove formed after the laser scribe processing tends to be shallower or narrower than that in an area containing no metal material (metal non-containing area) of the dicing region.

In the metal non-containing area, for example, an electrically insulating film is disposed. A laser beam typically used for the laser scribe processing has a wavelength in an ultraviolet range. The laser beam with such wavelength passes through the insulating film. The laser scribe processing uses the laser beam to ablate the semiconductor layer under the insulating film, so that the semiconductor layer is removed together with the insulating layer. In the metal non-containing area, adversely, the semiconductor layer is much removed, and the groove formed after the laser scribe processing tends to be deep and wide In addition, the laser scribe processing is carried out under the conditions with which an area including the most difficult material to be ablated (e.g., metal containing area) can be ablated. Therefore, in the metal containing area, as compared to in the metal non-containing area, the semiconductor layer tends to be further removed.

It is to be noted here that debris mainly composed of an organic substance can be well removed by a cleaning using an oxygen plasma. Debris containing an inorganic component, such as a semiconductor, a metal or a metal oxide, can be efficiently removed by a cleaning using a plasma containing oxygen and fluorine. In the removal, the oxygen plasma or the plasma containing oxygen and fluorine etches the semiconductor layer, too. In the dicing region having a thick protective film, however, ions are mostly consumed for removing the protective film, and the etching of the semiconductor layer is unlikely to proceed. On the other hand, in the dicing region having a thin protective film, the etching of the semiconductor layer proceeds, further deepening the groove. Likewise, in an area previously being the metal containing area, ions are mostly consumed for removing the debris, and the etching of the semiconductor layer is unlikely to proceed. On the other hand, in an area previously being the metal non-containing area, the etching of the semiconductor layer proceeds, further deepening the groove. In short, the variations in depth of the grooves formed by the laser scribe processing are increased by the cleaning using an oxygen plasma or a plasma containing oxygen and fluorine.

The plasma dicing is performed by, for example, a Bosch process, which alternately repeats a film deposition step and an etching step. According to the Bosch process, a film deposition step of forming a film inside (on the bottom and inner wall) the groove having been formed by the laser scribe processing is followed by an etching step of removing the film on the bottom of the groove to expose the semiconductor layer, and then removing the exposed semiconductor layer. In this process, the conditions for the film deposition step and the etching step are set such that the film formed on the inner wall of the groove in the film deposition step remains even after the etching step. This allows the semiconductor layer to be etched downward almost perpendicularly. In other words, in order to etch the semiconductor layer perpendicularly, thereby to improve the quality of the element chips, it is important that the film deposition step forms a film with uniform thickness on the grooves formed along the dicing regions.

However, when there are variations in depth and width between the grooves and in amount of debris adhering to the grooves, the thickness of the film formed inside the groove in the film deposition step tends to be non-uniform. For example, a film formed inside a deep groove (or a recess within the groove), including a film formed on the inner wall (or near the recess) of the groove, tends to be thin. On the inner wall where the film is thin, etching sideways in the horizontal direction, called side etching, tends to proceed in the etching step. This sometimes results in vertical stripes on the side surface of the obtained element chips, or an undercut at the interface between the semiconductor layer and the wiring layer. As a result, the appearance and the transverse intensity of the element chips tend to deteriorate. Depositing a film in enough thickness on the inner wall of a deep groove (or near a recess within the groove), however, forms an excessively thick film on the other area, still failing to perform a desired Bosch process.

Figure 1B:
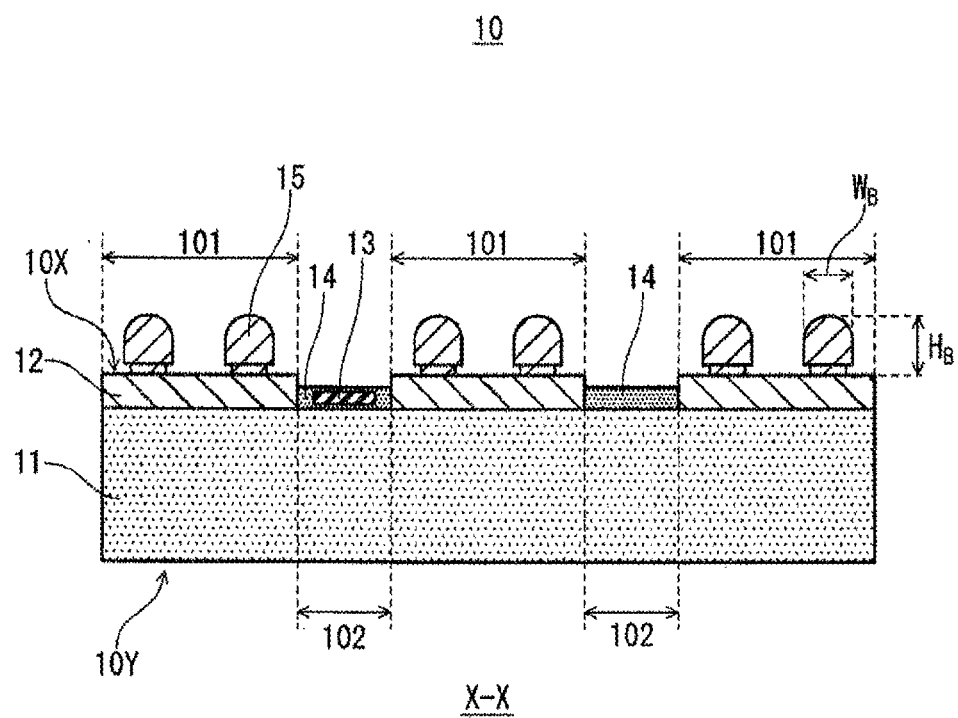
FIG. 1B is a sectional view of the substrate of FIG. 1A taken along a line X-X.
Figure 1C:
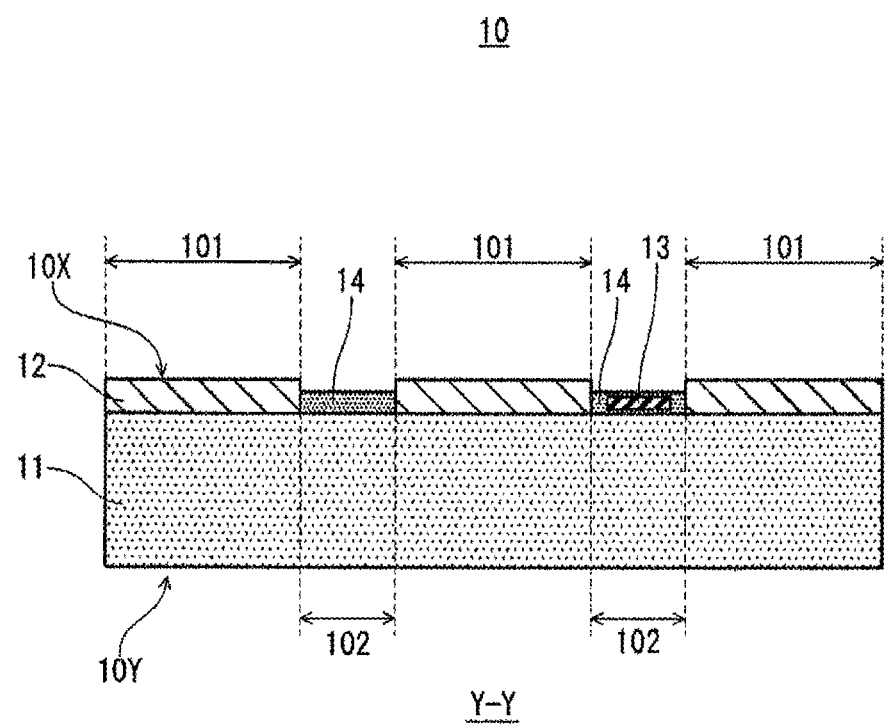
FIG. 1C is a sectional view of the substrate of FIG. 1A taken along a line Y-Y.

FIG. 1A is a schematic top view of an exemplary substrate. FIG. 1B is a sectional view of the substrate of FIG. 1A taken along a line X-X. FIG. 1C is a sectional view of the substrate of FIG. 1A taken along a line Y-Y. On the line X-X of a substrate 10, a bump 15 and a metal material 13 are disposed. In FIGS. 1A, 1B and 1C, for convenience's sake, the metal material is denoted by hatching. In the illustrated examples, for convenience's sake, components having the same function are denoted by the same reference numeral.

The substrate 10 includes a plurality of element regions 101 and a dicing region 102 defining the element regions 101 and has a first surface 10X and a second surface 10Y. The element regions 101 each include, for example, a semiconductor layer 11, and a wiring layer 12 laminated on the semiconductor layer 11 on the first surface 10X side. The wiring layer 12 further includes the bump 15. The dicing region 102 includes the semiconductor layer 11 and a second insulating film 14 laminated on the semiconductor layer 11 on the first surface 10X side. Etching the substrate 10 along the dicing region 102 provides element chips each having the semiconductor layer 11 and the wiring layer 12 having the bump 15.

Figure 2A:
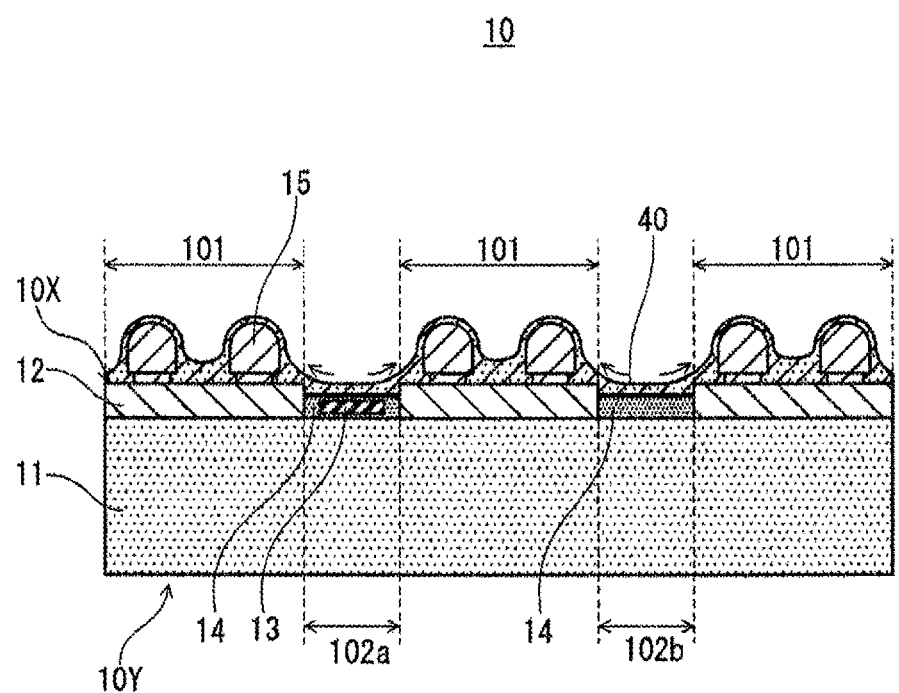
FIG. 2A is a sectional view schematically illustrating the cross section of FIG. 1B taken along the line X-X of the substrate with a protective film formed thereon.
Figure 2B:
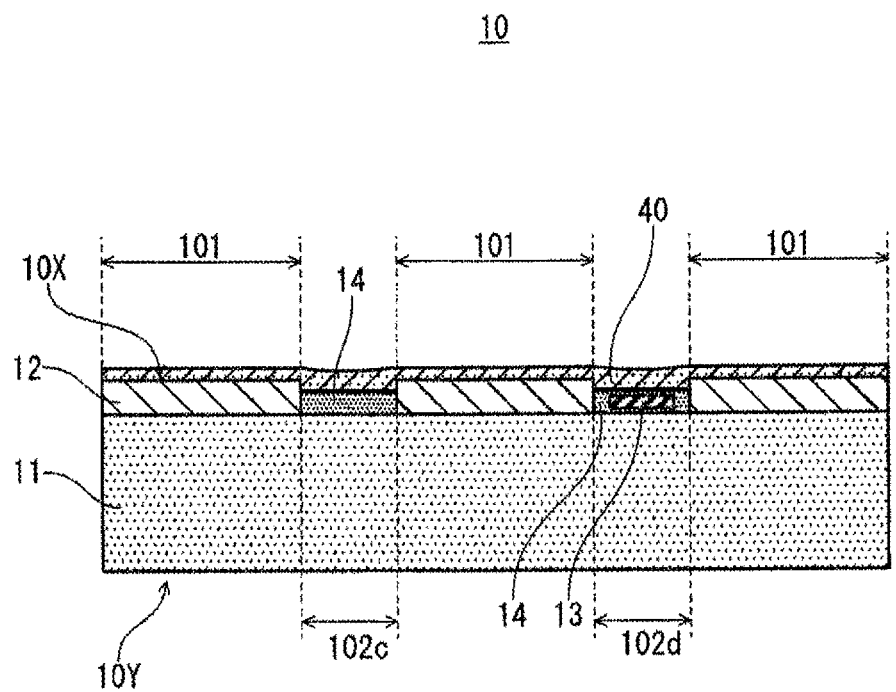
FIG. 2B is a sectional view schematically illustrating the cross section of FIG. 1C taken along the line Y-Y of the substrate with the protective film formed thereon.
Figure 3A:
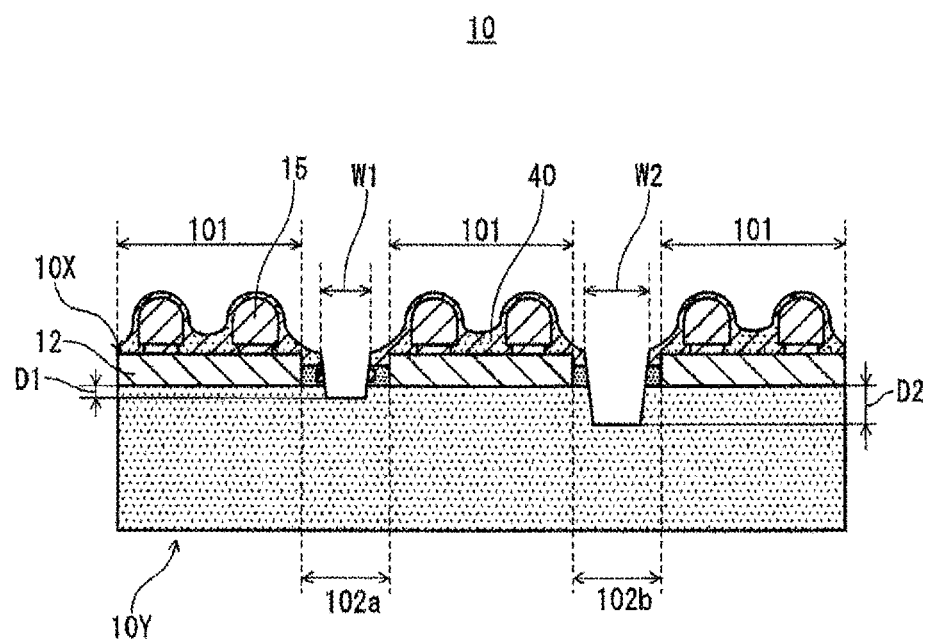
FIG. 3A is a sectional view schematically illustrating the cross section of FIG. 1B taken along the line X-X of the substrate after a laser scribing step.
Figure 3B:
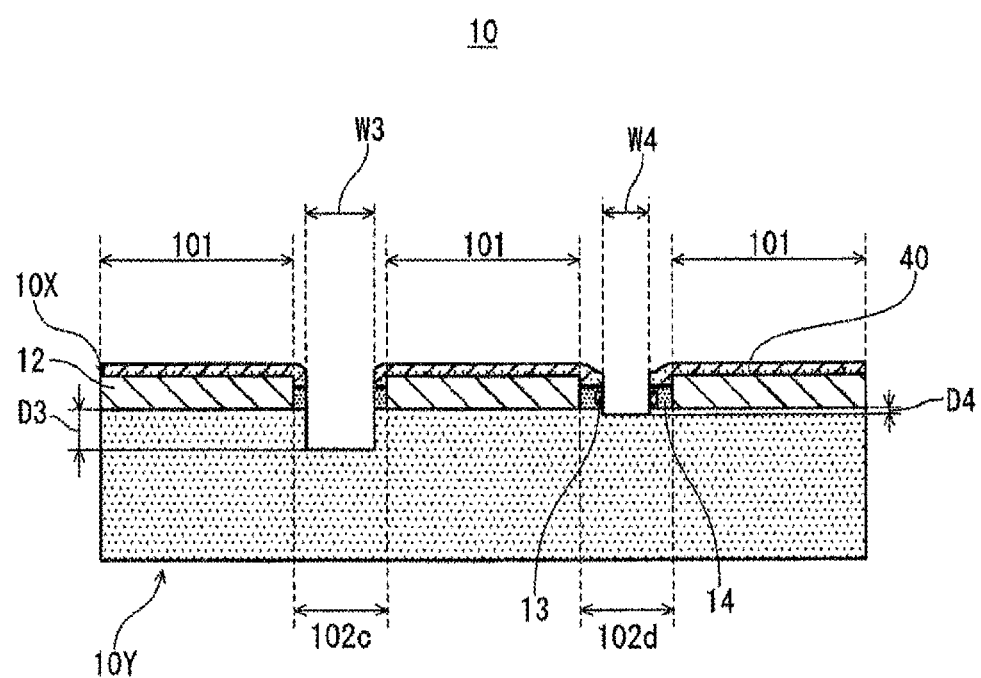
FIG. 3B is a sectional view schematically illustrating the cross section of FIG. 1C taken along the line Y-Y of the substrate after the laser scribing step.

FIG. 2A is a sectional view schematically illustrating the cross section of FIG. 1B taken along the line X-X of the substrate with a protective film formed thereon. FIG. 2B is a sectional view schematically illustrating the cross section of FIG. 1C taken along the line Y-Y of the substrate with the protective film formed thereon. FIG. 3A is a sectional view schematically illustrating the cross section of FIG. 1B taken along the line X-X of the substrate after a laser scribing step. FIG. 3B is a sectional view schematically illustrating the cross section of FIG. 1C taken along the line Y-Y of the substrate after the laser scribing step.

Figure 14A:
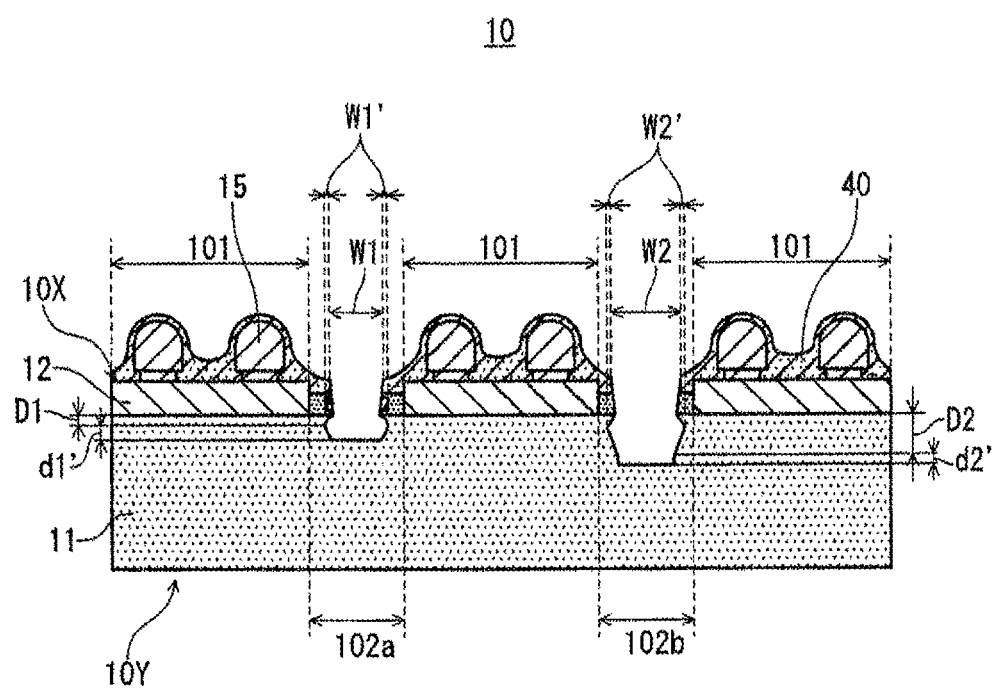
FIG. 14A is a sectional view schematically illustrating the cross section of FIG. 1B taken along the line X-X of a substrate having been subjected to a conventional plasma cleaning.
Figure 14B:
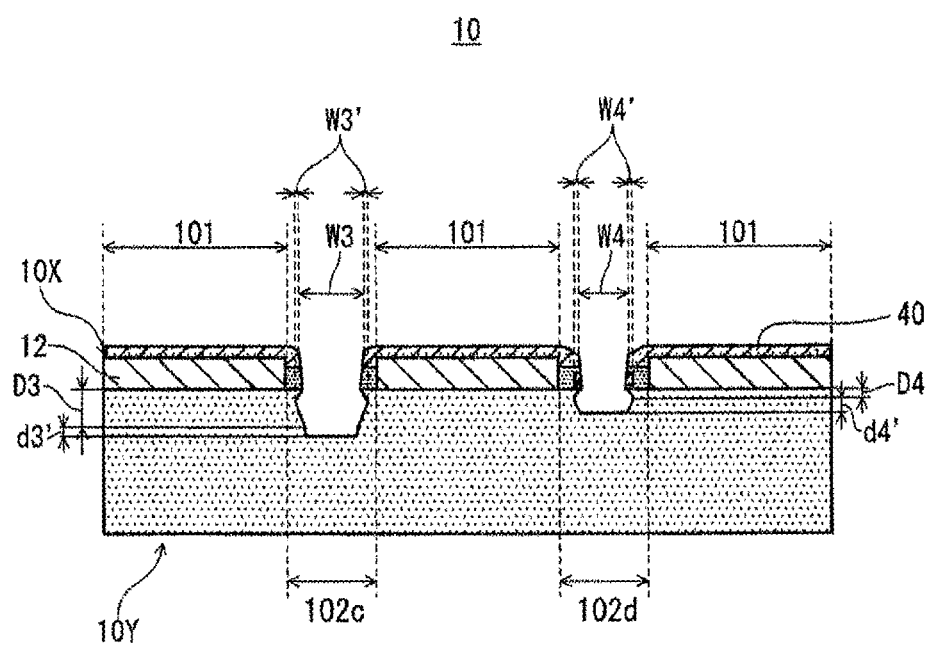
FIG. 14B is a sectional view schematically illustrating the cross section of FIG. 1C taken along the line Y-Y of the substrate having been subjected to the conventional plasma cleaning.
Figure 15A:
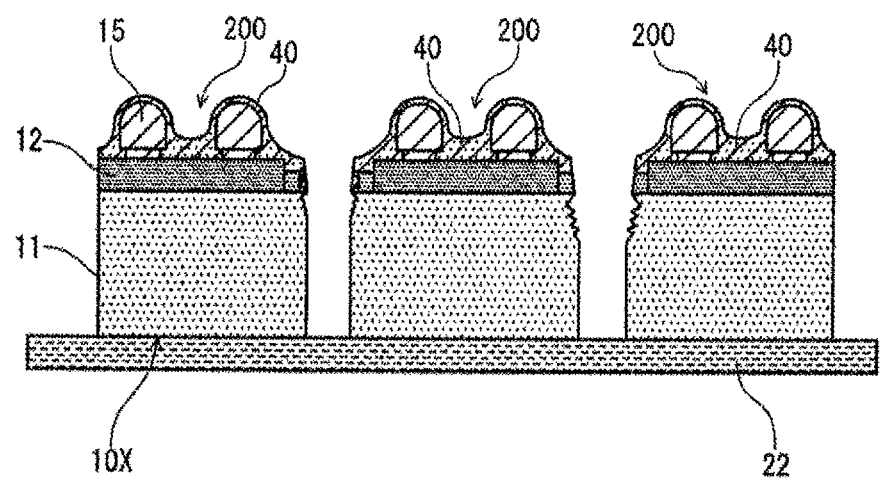
FIG. 15A is a sectional view schematically illustrating the cross section of FIG. 1B taken along the line X-X of the substrate having been subjected to a conventional plasma dicing.
Figure 15B:
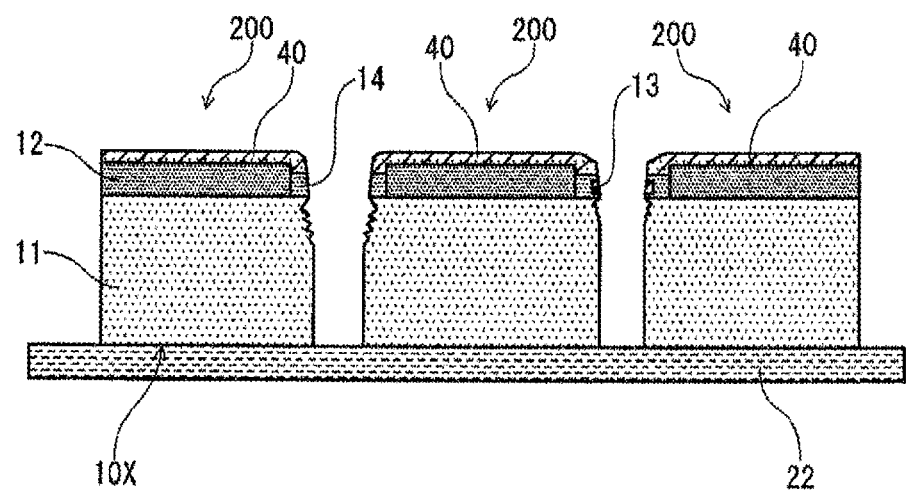
FIG. 15B is a sectional view schematically illustrating the cross section of FIG. 1C taken along the line Y-Y of the substrate having been subjected to the conventional plasma dicing.

FIG. 14A is a sectional view schematically illustrating the cross section of FIG. 1B taken along the line X-X of a substrate having been subjected to a conventional plasma cleaning. FIG. 14B is a sectional view schematically illustrating the cross section of FIG. 1C taken along the line Y-Y of the substrate having been subjected to the conventional plasma cleaning. FIG. 15A is a sectional view schematically illustrating the cross section of FIG. 1B taken along the line X-X of the substrate having been subjected to a conventional plasma dicing. FIG. 15B is a sectional view schematically illustrating the cross section of FIG. 1C taken along the line Y-Y of the substrate having been subjected to the conventional plasma dicing.

A dicing region 102a is in the vicinity of the bump 15 and includes the metal material 13. A dicing region 102b is in the vicinity of the bump 15 but does not include the metal material 13. A dicing region 102c is not in the vicinity of the bump 15 and does not include the metal material 13. A dicing region 102d is not in the vicinity of the bump 15, but includes the metal material 13.

A protective film 40 is formed so as to cover the first surface 10X of the substrate 10. When there is the bump 15 in the element region 101 (esp., near the peripheral edge), however, as compared in FIGS. 2A and 2B, the protective film 40 is attracted toward the bump 15 by surface tension, and the protective film 40 covering the neighboring dicing region 102 tends to be thinner than assumed. For example, the protective films 40 at the dicing regions 102a and 102b in FIG. 2A are thinner those at the dicing regions 102c and 102d in FIG. 2B. Therefore, when the laser scribe processing is applied to the dicing regions 102a and 102b, the formed grooves become deeper or wider than assumed.

In addition, since the dicing regions 102a and 102d are the metal containing regions containing the metal material 13, the underlying semiconductor layers 11 at these regions are difficult to be ablated as compared to those at the dicing regions 102b and 102c which are metal non-containing regions. Therefore, this laser scribe processing is carried out under the conditions with which the dicing region 102a and 102d can be ablated. Therefore, the semiconductor layers 11 at the dicing regions 102b and 102c tend to be further removed, and the formed grooves become deeper or wider than assumed.

As a result of these, as shown in FIGS. 3A and 3B, depths D1, D2, D3 and D4 of the grooves formed by the laser scribe processing along the dicing regions 102a, 102b, 102c and 102d, respectively, can satisfy, for example, D2>D3>D1>D4. Widths W1, W2, W3 and W4 of the grooves formed by the laser scribe processing along the dicing regions 102a, 102b, 102c and 102d, respectively, can satisfy, for example, W2>W3>W1>W4. Amounts Db1, Db2, Db3 and Db4 of the debris produced by the laser scribe processing along the dicing regions 102a, 102b, 102c and 102d, respectively, can satisfy, for example, Db1>Db4>Db2>Db3.

As described above, there are variations in depth and in width, and further in the amount of debris, among the grooves formed by the laser scribe processing. When, in this state, the plasma cleaning using an oxygen plasma or a plasma containing oxygen and fluorine is performed, the variations are further increased. For example, as shown in FIGS. 14A and 14B, the depth D1 and the width W1 of the groove formed along the dicing region 102a is further increased by d1' and 2×w1', respectively. The depth D2 and the width W2 of the groove formed along the dicing region 102b is further increased by d2' and 2×w2', respectively. The depth D3 and the width W3 of the groove formed along the dicing region 102c is further increased by d3' and 2×w3', respectively. The depth D4 and the width W4 of the groove formed along the dicing region 102d is further increased by d4' and 2×w4', respectively.

Furthermore, when the plasma dicing is performed in this state, element chips 200 obtained by the dicing will have shape abnormalities, such as side etching and undercut, on its side surface, as shown in FIGS. 15B and 15A.

To address this, the present embodiment performs a cleaning using a plasma generated from a process gas containing a carbon oxide gas. This can remove the debris, while suppressing an increase in variations in depth of the grooves formed by the laser scribe processing. Thus, through a plasma dicing that follows, desired element chips can be obtained.

Carbon oxide is a compound of carbon and oxygen, which is expressed by, for example, $C_xO_y$ (x=1 to 5, y=1, 2). Examples thereof include carbon monoxide (CO), oxygen dioxide ($CO_2$), tricarbon dioxide, and pentacarbon dioxide. These are used singly or in combination of two or more kinds. In terms of ease of availability, the carbon oxide gas may be CO or $CO_2$.

The reason why an increase in variations in depth of the grooves can be suppressed is presumably as follows.

When the process gas contains a carbon oxide gas having oxygen atoms and carbon atoms, oxygen ions and radicals originating from the carbon oxide gas, as well as carbon ions and radicals originating from the carbon oxide gas, are produced in a plasma generated in a plasma processing unit. Some of the carbon ions and radicals react with oxygen to form CO and are discharged from the plasma processing unit; the rest of them adhere as a carbon component inside the plasma processing unit (e.g., onto the substrate). When an enough amount of carbon oxide gas is introduced as the processing gas into the unit, carbon ions and radicals collide with the surface (the bottom and the inner wall) of the grooves having been formed by the laser scribe processing. Upon collision of carbon ions and radicals with the grooves, carbon (C) originating from the carbon ions and radicals adheres onto the surfaces of the grooves.

On the other hand, when oxygen ions and radicals collide with the grooves, the debris is oxidized and decomposed, and removed. At the same time, the surfaces of the grooves may possibly be etched. However, since carbon (C) originating from the carbon oxide gas is adhering to the same surfaces, the rate at which the grooves are etched is low, as compared to that using a gas other than the carbon oxide gas. Therefore, even though the above cleaning using the carbon oxide gas is fully performed for removing a lot of debris, the variations in depth of the grooves are unlikely to be increased, and the side etching is unlikely to occur, making it possible to improve the processing quality of the plasma dicing. Moreover, since oxygen ions hardly collide with the inner walls of the grooves, the inner walls of the grooves tend to be further protected with carbon (C).

Note that when oxygen ions and radicals collide with the protective film, much of the carbon contained in the protective film react with the oxygen ions and radicals to form CO and are discharged from the plasma processing unit. In the case of using a gas containing fluorine, fluorine ions and radicals act similarly to oxygen ions and radicals.

In the case of using a fluorocarbon gas, such as $CF_4$ or $C_4F_8$, as a carbon source to generate a plasma, the plasma will contain not only ions and radicals of C and F but also $CF_x$ and $C_yF_z$. This is because dissociation of C from F does not proceed sufficiently. For example, $CF_x$ produced through dissociation in $CF_4$ is not effective to remove the debris, failing to provide a satisfactory cleaning effect. Furthermore, $CF_x$ is unlikely to adhere onto the substrate surface, failing to sufficiently suppress the variations in depth of the grooves. On the other hand, $C_yF_z$ produced through dissociation in $C_4F_8$ polymerizes itself, and tends to deposit in a thin film on the substrate surface. In other words, with $C_yF_z$, cleaning effect is difficult to obtain.

The ratio of the carbon oxide gas (CO percentage) in the process gas is not limited. In view of protecting the groove surface, the CO percentage may be 10 vol % or more and 100 vol % or less, or 30 vol % or more and 80 vol % or less. The CO percentage may be adjusted according to the ratio of the area of the dicing regions (opening ratio) to the area of one principal surface of the substrate. The opening ratio is usually 0.5% or more and 80% or less. In this case, the CO percentage is preferably 10 vol % or more and 80 vol % or less. Particularly when the opening ratio is 0.5% or more and 10% or less, the CO percentage is preferably 30 vol % or more and 50 vol % or less. When the opening ratio is 10% or more and 20% or less, the CO percentage is preferably 50 vol % or more and 80 vol % or less. The CO percentage may be further adjusted according to the amount of the adhering debris, the width of the dicing region, and others.

The process gas may further contain a fluorine-containing gas. Examples of the fluorine-containing gas include $SF_6$ and fluorohydrocarbon. This can further improve the debris removal effect. The process gas may further contain other gases, such as oxygen gas and rare gas (e.g., Ar or He). In the present embodiment, the carbon oxide gas containing carbon atoms that protect the groove surfaces is added independently from the gas that exhibits a strong etching effect (e.g., fluorine-containing gas, oxygen gas). Therefore, the concentration of the carbon oxide gas can be set as appropriate, with taken into consideration the presence or absence of the metal material and the insulating film, the difference in size of the metal materials, the difference in thickness of the insulating films, and others. Therefore, the manufacturing method according to the present embodiment is applicable to various substrates.

The substrate may include a metal material at the dicing region. The metal material can be removed by a laser scribing step. Even though variations are caused in the depth of the grooves by the laser scribing step due to the presence or absence of the metal material, according to a cleaning step of the present embodiment, the variations in depth of the grooves are unlikely to increase.

A manufacturing method according to the present embodiment will be described below with reference to the drawings as appropriate.

Figure 4:
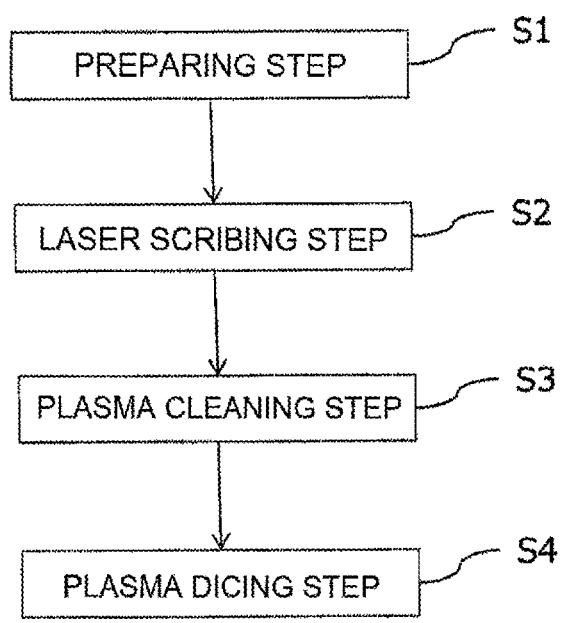
FIG. 4 is a flowchart of a manufacturing method according to one embodiment of the present invention.

FIG. 4 is a flowchart of a manufacturing method according to the present embodiment.

The present embodiment includes: a preparing step (S1) of preparing a substrate including a plurality of element regions and a dicing region defining the element regions, the substrate having a first surface and a second surface opposite the first surface; a laser scribing step (S2) of applying a laser beam to the dicing region from the first surface side, to form a groove corresponding to the dicing region and being shallower than a thickness of the substrate; a cleaning step (plasma cleaning step S3) of exposing the first surface of the substrate to a first plasma, to remove debris on the groove; and a dicing step (plasma dicing step S4) of exposing the substrate at a bottom of the groove to a second plasma after the cleaning step, to dice the substrate into element chips having the element regions.

The first plasma is generated from a process gas containing a carbon oxide gas. This can remove the debris, while suppressing an increase in variations in depth between the grooves formed by the laser scribing step. Therefore, through the subsequent plasma dicing step, desired element chips with high quality can be obtained.

Figure 5:
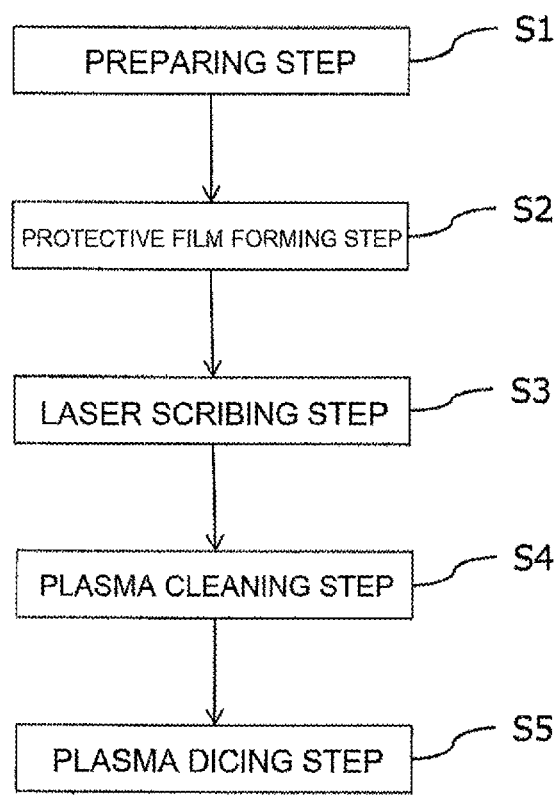
FIG. 5 is a flowchart of a manufacturing method according to another embodiment of the present invention.

FIG. 5 is a flowchart of a manufacturing method according to another embodiment of the present invention. The present embodiment is the same as the manufacturing method shown in FIG. 4 except that a protective film forming step S2 of covering the first surface with a protective film is performed before the laser scribing step. The protective film protects the element regions from plasma exposure in the plasma cleaning and plasma dicing steps that follow. This can reduce the defects caused by charge-up of the element chips and the contamination of the element chips with the material produced by etching. In view of ease of handling, the steps after the plasma cleaning step may be carried out, with the substrate held on a conveying carrier.

A detailed description is given first of one embodiment of component members used in the manufacturing method according to the present embodiment. The configuration of each component member is not limited thereto.

Substrate

A substrate includes a plurality of element regions and a dicing region defining the element regions and has a first surface and a second surface. The element regions each include, for example, a semiconductor layer and a wiring layer laminated on the first surface of the semiconductor layer. Etching the substrate along the dicing region provides element chips each having the semiconductor layer and the wiring layer.

The substrate may be of any size, and the maximum diameter thereof is, for example, about 50 mm to 300 mm. The substrate may be of any shape, and is, for example, circular or rectangular. The substrate may be provided with a cutout (not shown), such as an orientation flat (orifla) or a notch.

The semiconductor layer contains, for example, silicon (Si), gallium arsenide (GaAs), gallium nitride (GaN), or silicon carbide (SiC). The semiconductor layer in the element chip may have any thickness; the thickness is, for example, 20 μm to 1000 μm, and may be 50 μm to 300 μm.

The wiring layer constitutes, for example, a semiconductor circuit, an electronic component element, or MEMS. The wiring layer may include an electrically insulating film (first insulating film), a metal material, a resin layer (e.g., polyimide), a resist layer, an electrode pad, a bump, and others. The first insulating film may be in the form of a laminate with a wiring metal material (e.g., multilevel interconnect layer, redistribution layer). The bump disposed on the wiring layer may be of any shape and size. The bump may have a height $H_B$ of, for example, 20 μm or more and 70 μm or less, and a diameter $W_B$ of, for example, 20 μm or more and 70 μm or less.

The substrate at the dicing region includes, for example, in addition to the semiconductor layer, an electrically insulating film (second insulating film), a test circuit called TEG, and a metal material including copper (Cu) or aluminum (Al). The second insulating film includes, for example, silicon dioxide ($SiO_2$) or silicon nitride ($Si_3N_4$).

The shape of the dicing region may be set as appropriate according to the shape of desired element chips, without limited to a straight linear shape, and may be, for example, a zigzag shape or a wavy line shape. The element chip is, for example, rectangular or hexagonal in shape.

The width of the dicing region may be set as appropriate according to the sizes of the substrate and the element chips, and others. The width of the dicing region is, for example, 10 μm or more and 300 μm or less. A plurality of the dicing regions may have the same width or different widths. The dicing region is typically formed in plural numbers on the substrate. The pitch between the dicing regions adjacent to each other also may be set as appropriate according to the sizes of the substrate and the element chips, and others.

Conveying Carrier

A conveying carrier includes a frame and a holding sheet secured to the frame.

The frame is a frame member having an opening equal to or greater in area than the whole substrate, and has a predetermined width and a substantially consistent thin thickness. The frame has such a rigidity that it can be transferred with the holding sheet and the substrate held thereon. The opening of the frame may be of any shape, for example, circular, rectangular, or polygonal, such as hexagonal. The frame may be made of any material, for example, a metal, such as aluminum or stainless steel, or a resin.

The holding sheet may be made of any material. For easy attachment of the substrate thereto, the holding sheet preferably includes an adhesive layer and a non-adhesive layer with flexibility.

The non-adhesive layer may be made of any material, for example, polyolefin such as polyethylene and polypropylene, polyvinyl chloride, polyester such as polyethylene terephthalate, and other thermoplastic resins. The non-adhesive layer may include a rubber component for adding elasticity (e.g., ethylene-propylene rubber (EPM), ethylene-propylene-diene rubber (EPDM)), and various additives, such as a plasticizer, a softener, an antioxidant, and an electrically conductive material. The thermoplastic resin may have a functional group that reacts during photopolymerization reaction, such as an acryl group. The non-adhesive layer may have any thickness; the thickness is, for example, 50 μm or more and 300 μm or less, preferably 50 μm or more and 150 μm or less.

The holding sheet is attached at its periphery to the frame, with the side where the adhesive layer is disposed (adhesive side) in contact with the frame, to cover the opening of the frame. On a portion of the adhesive side exposed from the opening of the frame, the substrate is placed, with one of its principal surfaces (second surface) in contact with the adhesive side. The substrate is thus held on the holding sheet. The substrate may be held on the holding sheet via a die attach film (DAF).

The adhesive layer is preferably made of an adhesive component, the adhesive strength of which is reduced by ultraviolet (UV) radiation. In picking up element chips after plasma dicing, by applying UV radiation, the element chips can be easily separated from the adhesive layer, which eases the picking up. The adhesive layer can be obtained by, for example, applying an UV curing acrylic adhesive on one side of the non-adhesive layer in a thickness of 5 μm or more and 100 μm or less, preferably 5 μm or more and 15 μm or less.

Figure 6A:
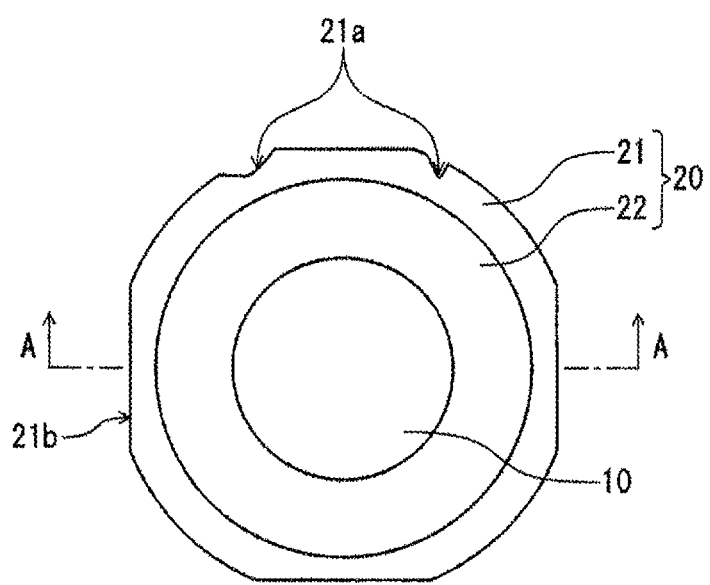
FIG. 6A is a schematic top view of a substrate held on a conveying carrier.
Figure 6B:
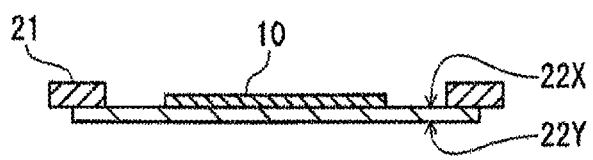
FIG. 6B is a sectional view taken along a line A-A of FIG. 6A.

FIG. 6A is a schematic top view of a substrate held on a conveying carrier. FIG. 6B is a sectional view taken along a line A-A of FIG. 6A. A conveying carrier 20 includes a frame 21 and a holding sheet 22 secured to the frame 21. The frame 21 may be provided with a notch 21a and a corner cut 21b for correct positioning. An adhesive side 22X is attached at its periphery to one side of the frame 21, and on a portion of the adhesive side 22X exposed from the opening of the frame 21, one of the principal surfaces of the substrate 10 is attached. In plasma processing, the holding sheet 22 is placed on a stage disposed in a plasma processing unit such that a non-adhesive side 22Y opposite the adhesive side 22X contacts the stage.

Plasma Processing Unit

Figure 7:
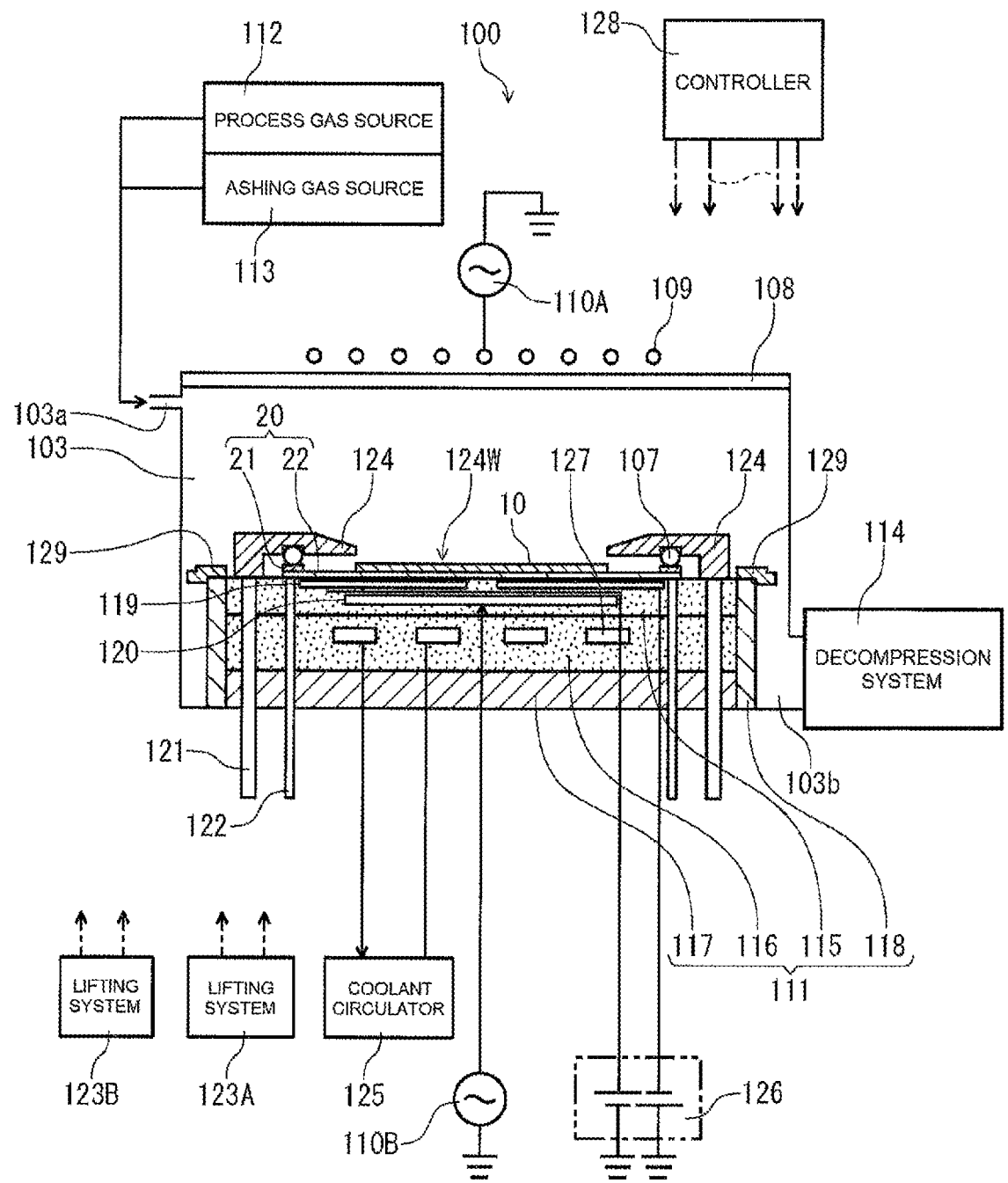
FIG. 7 is a schematic sectional diagram of a plasma processing unit.

Next, a detailed description is given of one embodiment of a plasma processing unit used in the plasma cleaning step and the plasma dicing step. FIG. 7 is a schematic sectional diagram of the plasma processing unit. The configuration of the plasma processing unit is not limited thereto.

A plasma processing unit 100 includes a stage 111. The conveying carrier 20 is set on the stage 111, with the substrate 10-holding surface of the holding sheet 22 upward. The stage 111 has such a size that the whole conveying carrier 20 can be seated thereon. Above the stage 111, a cover 124 having a window 124W for exposing at least part of the substrate 10 therefrom is arranged. The cover 124 is provided with holding members 107 for holding the frame 21 downward while the frame 21 is set on the stage 111. The holding members 107 are preferably a member that can achieve point contact with the frame 21 (e.g., coil spring, elastic resin). This can correct a distortion of the frame 21, while restricting a thermal communication between the frame 21 and the cover 124.

The stage 111 and the cover 124 are arranged in a vacuum chamber 103. The vacuum chamber 103 is approximately cylindrical in shape, with the top open. The open top is closed by a dielectric member 108 serving as a lid. Examples of the constituent material of the vacuum chamber 103 include aluminum, stainless steel (SUS), and aluminum with anodic oxide coating. Examples of the constituent material of the dielectric member 108 include yttrium oxide ($Y_2O_3$), aluminum nitride (AlN), alumina ($Al_2O_3$), quartz ($SiO_2$), and other dielectric materials. Above the dielectric member 108, a first electrode 109 serving as an upper electrode is arranged. The first electrode 109 is electrically connected to a first high-frequency power source 110A. The stage 111 is positioned on the bottom side in the vacuum chamber 103.

The vacuum chamber 103 is provided with a gas inlet 103a and a gas outlet 103b. The gas inlet 103a is connected to plasma-generating gas (process gas) supply sources, i.e., a process gas source 112 and an ashing gas source 113, each through a conduit. The gas outlet 103b is connected to a decompression system 114 including a vacuum pump for exhausting the gas within the vacuum chamber 103 to reduce the pressure therein. While the vacuum chamber 103 is supplied with a process gas, the first electrode 109 is supplied with a high-frequency power from the first high-frequency power source 110A. A plasma is thus generated in the vacuum chamber 103.

The stage 111 includes an electrode layer 115, a metal layer 116, and a base table 117 supporting the electrode layer 115 and the metal layer 116, each being approximately circular. The stage 111 further includes a peripheral member 118 surrounding the electrode layer 115, the metal layer 116, and the base table 117. The peripheral member 118 is formed of a metal having electrical conductivity and etching resistance, and serves to protect the electrode layer 115, the metal layer 116, and the base table 117 from plasma exposure. On the top surface of the peripheral member 118, an annular circumferential ring 129 is provided. The circumferential ring 129 serves to protect the top surface of the peripheral member 118 from plasma exposure. The electrode layer 115 and the circumferential ring 129 are formed of, for example, the dielectric material as mentioned above.

Within the electrode layer 115, an electrostatic chuck electrode (hereinafter, ESC electrode 119), and a second electrode 120 electrically connected to a second high-frequency power source 110B are disposed. The ESC electrode 119 is electrically connected to a DC power source 126. An electrostatic chuck system is composed of the ESC electrode 119 and the DC power source 126. The electrostatic chuck system pulls the holding sheet 22 onto the stage 111 and secures it thereto. Although a description will be made below of a case where the electrostatic chuck system is used as a securing system for securing the holding sheet 22 to the stage 111, this should not be taken as a limitation. A clamp (not shown) may be used for securing the holding sheet 22 to the stage 111.

The metal layer 116 is formed of, for example, aluminum with anodic oxidation coating. The metal layer 116 contains a coolant channel 127 configured to cool the stage 111. By cooling the stage 111, the holding sheet 22 set on the stage 111 is cooled down, and the cover 124 partially in contact with the stage 111 is also cooled down. This protects the substrate 10 and the holding sheet 22 from being damaged by being heated during plasma processing. A coolant in the coolant channel 127 is circulated by a coolant circulator 125.

The stage 111 is provided near its periphery with a plurality of support members 122 extending through the stage 111. The support members 122 support the frame 21 of the conveying carrier 20. The support members 122 are driven to move up and down by a first lifting system 123A. The conveying carrier 20, upon being delivered into the vacuum chamber 103, is passed onto the support members 122 that have been raised to a predetermined position. Then the support members 122 are lowered until their top surfaces become flush with or lower than the top surface of the stage 111, which sets the conveying carrier 20 at a predetermined position on the stage 111.

A plurality of lifting rods 121 are coupled to the cover 124 at its bottom end, to lift and lower the cover 124. The lifting rods 121 are driven to move up and down by a second lifting system 123B. The lifting and lowering operation of the cover 124 by the second lifting system 123B can be controlled independently from the operation by the first lifting system 123A.

Figure 8:
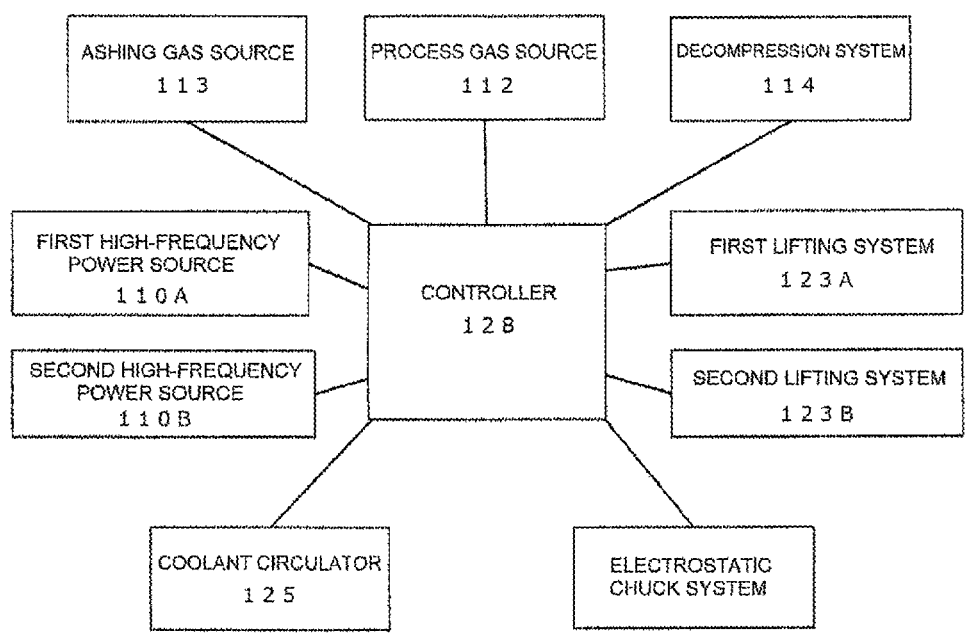
FIG. 8 is a block diagram of the plasma processing unit used in one embodiment of the present invention.

A controller 128 is configured to control the operations of component elements of the plasma processing unit 100 including the first and second high-frequency power sources 110A and 110B, the process gas source 112, the ashing gas source 113, the decompression system 114, the coolant circulator 125, the first and second lifting systems 123A and 123B, and the electrostatic chuck system. FIG. 8 is a block diagram of a plasma processing unit used in the present embodiment.

The etching of the substrate 10 is carried out, after the conveying carrier 20 holding the substrate 10 is delivered into the vacuum chamber and the substrate 10 is seated on the stage 111.

In delivering the substrate 10, within the vacuum chamber 103, the cover 124 is lifted to a predetermined position by means of the lifting rods 121. A gate valve (not shown) opens, and the conveying carrier 20 is delivered into the chamber. The support members 122 are on standby at a raised position. When the conveying carrier 20 reaches a predetermined position above the stage 111, the conveying carrier 20 is passed onto the support members 122. The conveying carrier 20 is placed on the top surface of the support members 122, with the adhesive side 22X of the holding sheet 22 upward.

After the conveying carrier 20 is passed onto the support members 122, the vacuum chamber 103 is hermetically closed. Next, the support members 122 start lowering. When the support members 122 are lowered until their top surfaces become flush with or lower than the top surface of the stage 111, the conveying carrier 20 is set on the stage 111. Then the lifting rods 121 are driven to lower the cover 124 to a predetermined position. The distance between the cover 124 and the stage 111 is adjusted such that the holding members 107 provided in the cover 124 come in point-contact with the frame 21. In this way, the frame 21 is pushed downward by the holding members 107, and simultaneously, the frame 21 is covered with the cover 124, and the substrate 10 is exposed from the window 124W.

The cover 124 is, for example, shaped like a doughnut having an approximately circular outline, and has a consistent width and a thin thickness. The diameter of the window 124W is smaller than the inner diameter of the frame 21, and the outer diameter of the cover 124 is greater than the outer diameter of the frame 21. Therefore, when the cover 124 is lowered while the conveying carrier 20 is set on the stage at a predetermined position, the cover 124 can cover the frame 21. From the window 124W, the substrate 10 is at least partially exposed.

The cover 124 is formed of, for example, a dielectric such as ceramics (e.g., alumina, aluminum nitride) or quarts, or a metal such as aluminum or aluminum with anodic oxidation coating. The holding members 107 can be formed of the above-mentioned dielectric or metal, or a resin material.

After the conveying carrier 20 is passed onto the support members 122, voltage is applied to the ESC electrode 119 from the DC power source 126. The holding sheet 22 is then brought into contact with the stage 111 and electrostatically chucked on the stage 111. The voltage application to the ESC electrode 119 may be initiated after the holding sheet 22 is set on (or in contact with) the stage 111.

When the etching ends, the gas in the vacuum chamber 103 is evacuated, and the gate valve opens. The conveying carrier 20 holding a plurality of element chips is delivered out of the plasma processing unit 100 by means of a delivering system having entered through the gate valve. After the conveying carrier 20 is delivered out, the gate valve is immediately closed. The conveying carrier 20 may be delivered out by reversely performing the above-mentioned delivering procedures for setting the conveying carrier 20 on the stage 11. Specifically, after the cover 124 is lifted to a predetermined position, the voltage applied to the ESC electrode 119 is cut off to release the conveying carrier 20 from the stage 111, and the support members 122 are raised. After the support members 122 reaches a predetermined raised position, the conveying carrier 20 is delivered out.

A manufacturing method corresponding to the flow shown in FIG. 5 is described below with reference to the drawings as appropriate.

(1) Preparing Step

First, a substrate subjected to dicing is prepared. The substrate is illustrated, for example, in FIGS. 1A to 1C.

(2) Protective Film Forming Step

A protective film is formed on the first surface of the substrate. The protective film is provided to protect the element regions from plasma exposure. Before the protective film forming step, the substrate may be held on the conveying carrier.

The protective film may have any thickness, but is preferably thick enough not to be completely removed in the plasma cleaning step and the plasma dicing step. The thickness of the protective film is set, for example, to be greater than a calculated amount (thickness) of the protective film to be etched in the plasma cleaning step and the plasma dicing step.

The protective film contains a resist material, such as a thermosetting resin (e.g., polyimide), a photoresist (e.g., phenol resin), or a water-soluble resist (e.g., acrylic resin).

The protective film can be formed by, for example, forming a resist material into a sheet and attaching the sheet to the first surface, or applying a liquid raw material of a resist material to the first surface using spin-coating or spray-coating technique. In the latter technique, the protective film tends to be non-uniform in thickness. The cross section of the substrate with the protective film formed thereon is shown, for example, in FIGS. 2A and 2B. As mentioned above, the presence or absence of the bump affects the thickness of the protective film formed at the dicing region.

A portion of the protective film corresponding to the dicing region may be removed before the laser scribing step. Before the laser scribing step, the protective film made of a photoresist can be removed by means of photolithography technique. The portion of the protective film corresponding to the dicing region may be removed in the laser scribing step.

(3) Laser Scribing Step

A laser beam is applied to the dicing region from the first surface side, thereby to form a groove corresponding to the dicing region and being shallower than the thickness of the substrate. In this process, along the dicing region, for example, the insulating film and the metal material are ablated to expose the semiconductor layer. As a result, on the protective film formed inside the groove or on the first surface of the substrate, the debris caused by ablating the metal material, the second insulating film and the protective film may adhere.

The cross section of the substrate after the laser scribing step is shown, for example, in FIGS. 3A and 3B. As mentioned above, the presence or absence of the bump and the metal material affects the width and depth of the groove formed along the dicing region.

(4) Plasma Cleaning Step

The first surface of the substrate is exposed to a first plasma generated from a process gas containing a carbon oxide gas. This allows carbon originating from carbon ions and radicals to attached onto the surface of the groove having been formed in the laser scribing step. On the other hand, oxygen ions and radicals collide with the groove, and remove the debris. In this way, the variations in depth and width between the grooves formed in the laser scribing step can be suppressed from being increased. The carbon may remain after the plasma cleaning step, or may be removed before the plasma cleaning step ends.

Figure 9A:
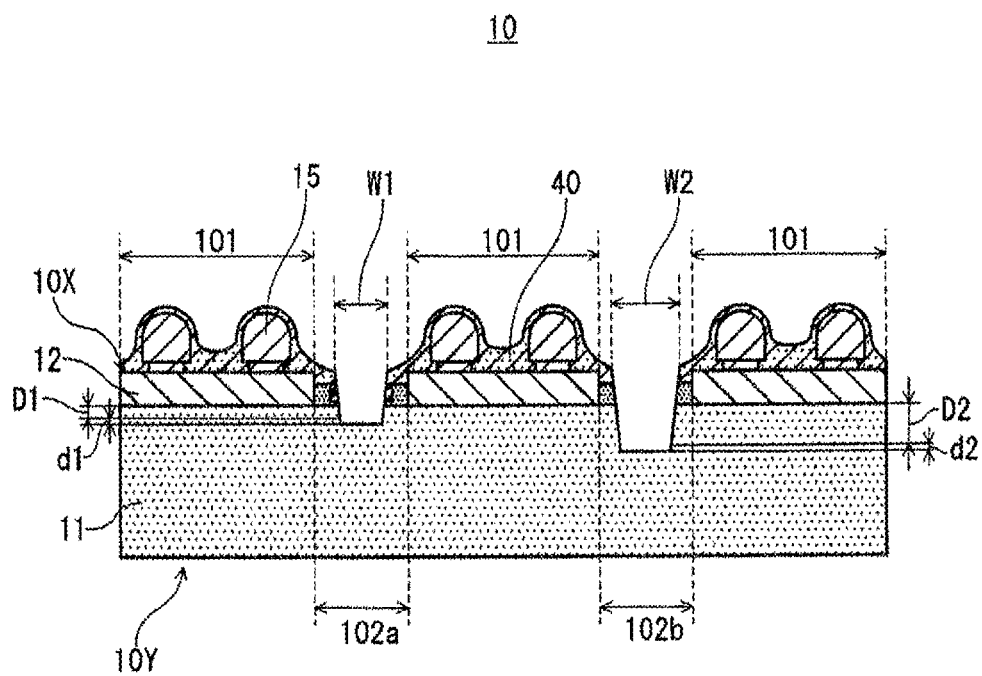
FIG. 9A is a sectional view schematically illustrating the cross section of FIG. 1B taken along the line X-X of the substrate after a cleaning step according to an embodiment of the present invention.
Figure 9B:
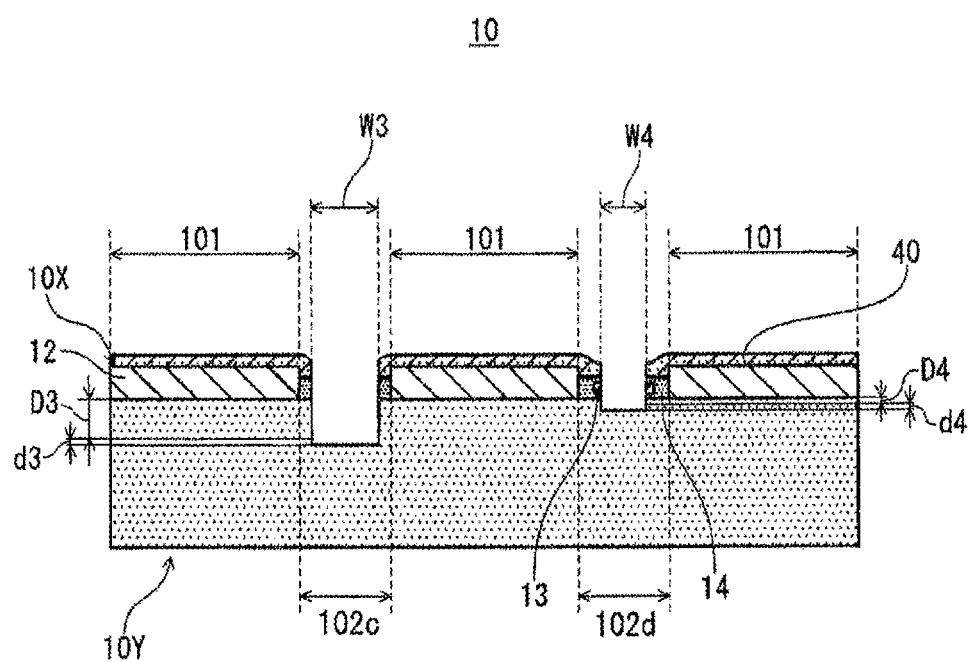
FIG. 9B is a sectional view schematically illustrating the cross section of FIG. 1C taken along the line Y-Y of the substrate after the cleaning step according to the embodiment of the present invention.

FIG. 9A is a sectional view taken along the line X-X, schematically illustrating a substrate after a plasma cleaning step according to the present embodiment. FIG. 9B is a sectional view taken along the line Y-Y, schematically illustrating the substrate after the plasma cleaning step according to the present embodiment.

As illustrated in FIG. 9A and FIG. 9B, according to the plasma cleaning of the present embodiment, the depths of the grooves formed along the dicing regions become deeper than those after laser scribing, but the increased depths are small, as compare to those when subjected to the conventional plasma cleaning using oxygen gas or a gas containing oxygen and fluorine. For example, the depths d1 to d4 etched along the dicing regions 102a to 102d by the plasma cleaning step of the present embodiment are respectively smaller than the depths d1' to d4' etched by the conventional plasma cleaning (see FIGS. 14A and 14B). Likewise, according to the plasma cleaning of the present embodiment, the widths of the grooves formed along the dicing regions are the same as or just slightly increased from those after laser scribing. For example, the widths etched along the dicing regions 102a to 102d by the plasma cleaning step of the present embodiment are respectively smaller than the widths w1' to w4' etched by the conventional plasma cleaning (see FIGS. 14A and 14B).

The process gas may further contain a fluorine-containing gas. This can improve the debris removal effect.

Specifically, for example, a mixed gas of $CO_2$, $O_2$ and $SF_6$ is introduced as a process gas into the vacuum chamber at a rate of 5 sccm or more and 500 sccm or less. The percentage of $CO_2$ in the mixed gas at this time may be 10 vol % or more and less than 100 vol %, or 30 vol % or more and 80 vol % or less. The percentage of $O_2$ in the mixed gas may be 70 vol % or less. The percentage of $SF_6$ in the mixed gas may be 70 vol % or less.

The other conditions for generating the first plasma are set according to the amount and components of the debris, and others.

For example, the pressure in the vacuum chamber may be 0.5 Pa or more and 30 Pa or less. The electric power supplied from the first high-frequency power source to the first electrode may be 500 W or more and 4800 W or less. A high-frequency power of 20 W or more 1000 W or less may be supplied to the second electrode, to apply a high biasing voltage on the stage with the substrate seated thereon. The processing time may be, for example, 3 seconds or more and 300 seconds or less.

As for the temperature of the stage, a lower temperature is preferable. For example, the temperature of the stage surface is preferably 15° C. or less, more preferably 0° C. or less. By lowering the temperature of the stage, thereby to lower the temperature of the substrate, carbon is made more likely to attach inside the groove.

(5) Plasma Dicing Step

The substrate at the bottom of the groove is exposed to a second plasma until it is etched to the second surface, thereby to dice the substrate into element chips having an element region. Since an increase in variations in width and depth of the grooves formed along the dicing regions is suppressed, shape abnormalities, such as side etching and undercut, are unlikely to occur.

The plasma cleaning step and the plasma dicing step may be performed using the same plasma processing unit or different plasma processing units. When using the same plasma processing unit, the plasma cleaning step and the plasma dicing step may be performed successively.

Figure 10A:
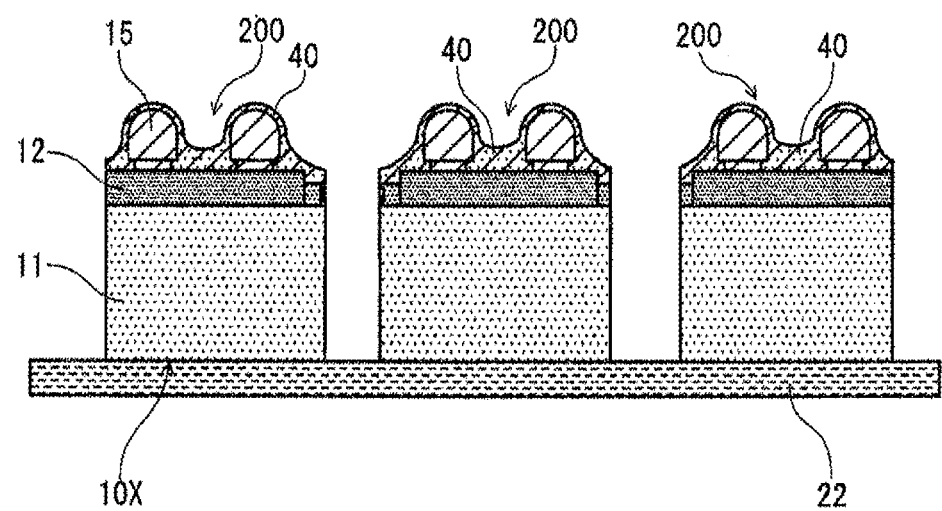
FIG. 10A is a sectional view schematically illustrating the cross section of FIG. 1B taken along the line X-X of element chips manufactured by a method according to the embodiment of the present invention.
Figure 10B:
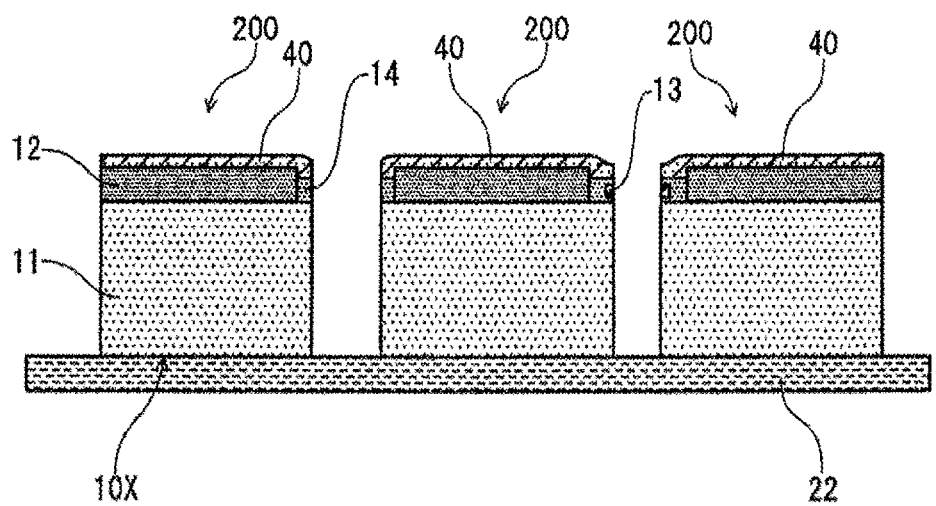
FIG. 10B is a sectional view schematically illustrating the cross section of FIG. 1C taken along the line Y-Y of the element chips manufactured by the method according to the embodiment of the present invention.

FIG. 10A is a sectional view taken along the line X-X, schematically illustrating element chips manufactured by a method according to the present embodiment. FIG. 10B is a sectional view taken along the line Y-Y, schematically illustrating the element chips manufactured by the method according to the present embodiment. Portions of the substrate 10 remaining in the thickness direction along the dicing regions 102 are etched, and the substrate 10 is diced into a plurality of the element chips 200 having the element region 101.

The conditions for generating the second plasma are set according to the material of the semiconductor layer, and others. The semiconductor layer is plasma-etched by, for example, a Bosch process. According to the Bosch process, the semiconductor layer is perpendicularly etched in the depth direction. When the semiconductor layer includes Si, the Bosch process repeats a deposition step, a deposited-film etching step, and a Si etching step in this order, to dig the semiconductor layer in the depth direction.

The deposition step is carried out, for example, under the following conditions: while supplying $C_4F_8$ as a process gas at a rate of 150 sccm to 500 sccm, the pressure in the vacuum chamber is controlled to 15 Pa to 25 Pa, with the input power to the first electrode from the first high-frequency power source set at 1500 W to 5000 W, the input power to the second electrode from the second high-frequency power source set at 0 W to 50 W; the processing time is 2 sec to 15 sec.

The deposited-film etching step is carried out, for example, under the following conditions: while supplying $SF_6$ as a process gas at a rate of 20 sccm to 800 sccm, the pressure in the vacuum chamber is controlled to 5 Pa to 15 Pa, with the input power to the first electrode from the first high-frequency power source set at 1500 W to 5000 W, the input power to the second electrode from the second high-frequency power source set at 300 W to 1000 W; the processing time is 2 sec to 10 sec.

The Si etching step is carried out, for example, under the following conditions: while supplying $SF_6$ as a process gas at a rate of 200 sccm to 800 sccm, the pressure in the vacuum chamber is controlled to 5 Pa to 25 Pa, with the input power to the first electrode from the first high-frequency power source set at 1500 W to 5000 W, the input power to the second electrode from the second high-frequency power source set at 50 W to 500 W; the processing time is 5 sec to 20 sec.

By repeating the deposition step, the deposited-film etching step, and the Si etching step under the conditions as above, the semiconductor layer containing Si can be etched perpendicularly in the depth direction at a rate of 10 μm/min to 20 μm/min.

After the substrate is individualized, ashing may be performed in the plasma processing unit. This can remove the protective film and further the carbon.

The ashing is performed, for example, under the following conditions: while supplying a mixed gas of $CF_4$ and $O_2$ (flow rate ratio $CF_4:O_2=1:10$) as an ashing gas at a rate of 150 sccm to 300 sccm, the pressure in the vacuum chamber is controlled to 5 Pa to 15 Pa, with the input power to the first electrode from the first high-frequency power source set at 1500 W to 5000 W, the input power to the second electrode from the second high-frequency power source set at 0 W to 300 W. The input power to the second electrode in the ashing step is preferably set lower than that in the plasma dicing step.

When the protective film is water-soluble, the protective film may be removed by washing with water, instead of ashing.

After the plasma dicing step, the element chips are picked up from the holding sheet.

The element chips are, for example, pushed up together with the holding sheet by push-up pins from the non-adhesive side of the holding sheet. This causes at least part of the element chips to float up from the holding sheet. Then, the element chips are picked up from the holding sheet by a pick-up unit.

The present invention will be specifically described below with reference to Examples. The present invention, however, is not limited to the following Examples.

EXAMPLE 1

(1) Preparing Step and Protective Film Forming Step

A substrate having a semiconductor layer (thickness: approx. 90 μm) and a wiring layer (thickness: approx. 7 μm) was prepared. A protective film (thickness: approx. 57 μm) was formed on the wiring layer of the substrate by spin coating.

(2) Laser Scribing Step

Figure 11:
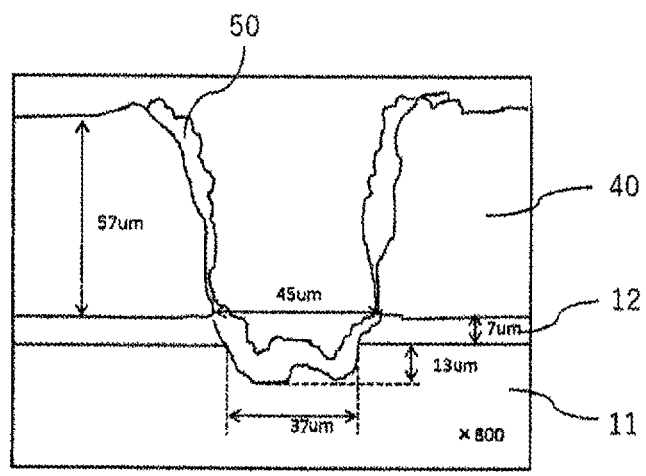
FIG. 11 is a sectional view obtained by tracing an SEM image of an essential part of a substrate after the laser scribing step in Example 1.

A laser beam was applied to the dicing regions from the protective film side, to remove the protective film and the wiring layer at the dicing regions. FIG. 11 is a sectional view obtained by tracing a scanning electron microscope (SEM) image (magnification: 800×) of an essential part of the substrate after the laser scribing step. The depth of the groove thus formed measured approximately 13 μm in the semiconductor layer 11. The width of the groove thus formed measured in the wiring layer 12 was approximately 45 μm, and the greatest width measured in the semiconductor layer 11 was approximately 37 μm. Debris 50 was attached to the bottom and the inner wall of the groove.

(3) Plasma Cleaning Step

Figure 12:
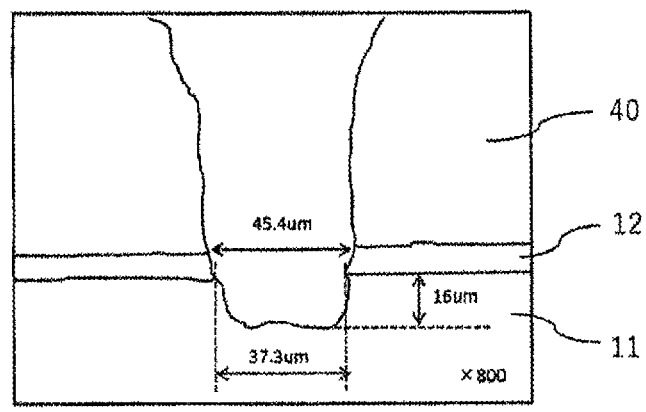
FIG. 12 is a sectional view obtained by tracing an SEM image of an essential part of the substrate after a plasma cleaning step in Example 1.

With a plasma processing unit as shown in FIG. 7, the substrate was exposed to a first plasma, so that the debris on the groove was removed. A mixed gas of $CO_2$ and $SF_6$ was used as a process gas. $CO_2$ and $SF_6$ were supplied each at a rate of 100 sccm. With the pressure in the vacuum chamber controlled to 5 Pa, the input power to the first electrode set at 2500 W, and the input power to the second electrode set at 200 W, this step was performed for 45 sec. FIG. 12 is a sectional view obtained by tracing an SEM image (magnification: 800×) of an essential part of the substrate after the plasma cleaning step. The debris inside the groove had been removed. The depth of the groove was measured approximately 16 μm in the semiconductor layer 11, which was a little increased by the cleaning step. The width of the groove measured in the wiring layer 12 was approximately 45.4 μm, and the greatest width measured in the semiconductor layer 11 was approximately 37.3 μm, both of which were almost the same as those after the laser scribing step.

(4) Plasma Dicing Step

Figure 13:
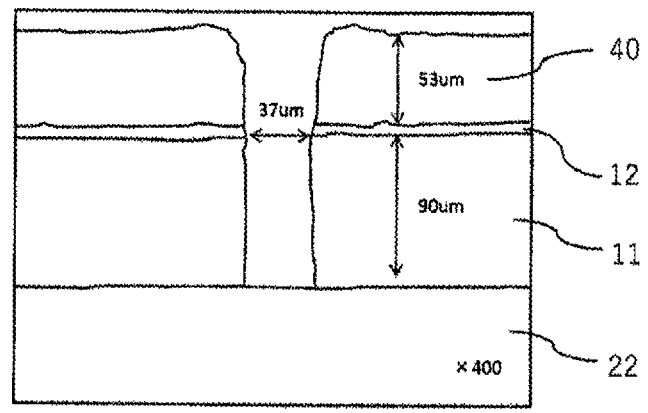
FIG. 13 is a sectional view obtained by tracing an SEM image of an essential part of element chips manufactured in Example 1.

Subsequently, the dicing regions were exposed to a second plasma generated under the conditions different from those for generating the first plasma, and the substrate was diced into element chips. FIG. 13 is a sectional view obtained by tracing an SEM image (magnification: 400×) of an essential part of element chips thus manufactured. The end face of the semiconductor layer 11 was approximately flat and had almost no shape abnormalities, such as side etching and undercut.

Dicing of the substrate into element chips with the second plasma was performed by a Bosh process. In the Bosch process, a deposition step, a deposited-film etching step, and a Si etching step were performed in this order as one cycle, and repeated 25 cycles in total.

In the deposition step, $C_4F_8$ was used as a process gas. $C_4F_8$ was supplied at a rate of 400 sccm. With the pressure in the vacuum chamber controlled to 15 Pa, the input power to the first electrode set at 4800 W, and the input power to the second electrode set at 50 W, this step was performed for 3 sec.

In the deposed-film etching step, $SF_6$ was used as a process gas. $SF_6$ was supplied at a rate of 600 sccm. With the pressure in the vacuum chamber controlled to 20 Pa, the input power to the first electrode set at 4800 W, and the input power to the second electrode set at 300 W, this step was performed for 2 sec.

In the Si etching step, $SF_6$ was used as a process gas. $SF_6$ was supplied at a rate of 600 sccm. With the pressure in the vacuum chamber controlled to 20 Pa, the input power to the first electrode set at 4800 W, and the input power to the second electrode set at 50 W, this step was performed for 5 sec.

COMPARATIVE EXAMPLE 1

The preparing step and protective film forming step (1) and the laser scribing step (2) were performed as in Example 1.

(3) Plasma Cleaning Step

Figure 16:
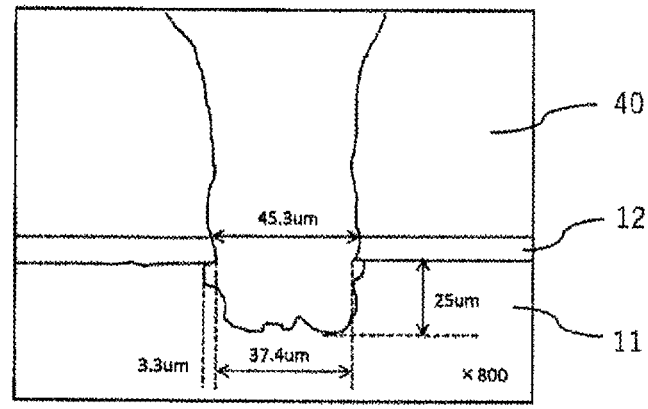
FIG. 16 is a sectional view obtained by tracing an SEM image of an essential part of a substrate after a plasma cleaning step in Comparative Example 1.

The plasma cleaning step was performed as in Example 1, except that $O_2$ was used as a process gas instead of $CO_2$. FIG. 16 is a sectional view obtained by tracing an SEM image (magnification: 800×) of an essential part of the substrate after the plasma cleaning step. The debris inside the groove had been removed. The depth of the groove was measured approximately 25 μm in the semiconductor layer 11, which was increased by about 2 times by the cleaning step. The width of the groove measured in the wiring layer 12 was approximately 45.3 μm, showing little change; however, the semiconductor layer 11 had an undercut of approximately 3.3 μm in depth, and the greatest width measured in the semiconductor layer 11 was increased by more than approximately 6 μm.

(4) Plasma Dicing Step

Figure 17:
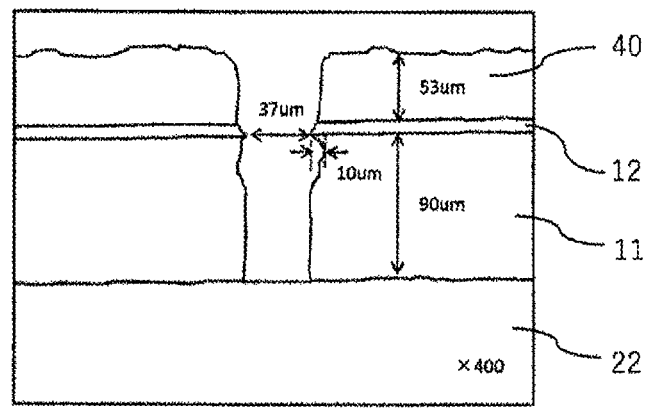
FIG. 17 is a sectional view obtained by tracing an SEM image of an essential part of element chips manufactured in Comparative Example 1.

Subsequently, the substrate was diced into element chips as in Example 1. FIG. 17 is a sectional view obtained by tracing an SEM image (magnification: 400×) of an essential part of element chips thus manufactured. The semiconductor layer 11 had at its side surface a side etching of approximately 10 μm in depth.

According to the element chip manufacturing method of the present invention, desired plasma dicing can be performed. The element chip manufacturing method of the present invention is therefore useful as a method of manufacturing element chips from various substrates.

REFERENCE NUMERALS

10: substrate
10X: first surface
10Y: second surface
101: element region
102, 102a to 102d: dicing region
11: semiconductor layer
12: wiring layer
13: metal material
14: second insulating film
15: bump
20: conveying carrier
21: frame
   21a: notch
   21b: corner cut
22: holding sheet
22X: adhesive side
22Y: non-adhesive side
40: protective film
50: debris
100: plasma processing unit
103: vacuum chamber
   103a: gas inlet
   103b: gas outlet
108: dielectric member
109: first electrode
110A: first high-frequency power source
110B: second high-frequency power source
111: stage
112: process gas source
113: ashing gas source
114: decompression system
115: electrode layer
116: metal layer
117: base table
118: peripheral member
119: ESC electrode
120: second electrode
121: lifting rod
122: support member 123A: first lifting system
123B: second lifting system
124: cover
  124W: window
125: coolant circulator
126: DC power source
127: coolant channel
128: controller
129: circumferential ring
200: element chip

What is claimed is:

1. An element chip manufacturing method comprising:
a preparing step of preparing a substrate including a plurality of element regions and a dicing region defining the element regions, the substrate having a first surface and a second surface opposite the first surface, the dicing region including a metal containing area where a metal material is disposed and a metal non-containing area where no metal material is contained;
a laser scribing step of applying a laser beam to the dicing region from a side of the first surface, to form a groove corresponding to the dicing region and being shallower than a thickness of the substrate, the groove having variations in depth such that a depth of the groove formed at the metal containing area is smaller than a depth of the groove formed at the metal non-containing area;
a cleaning step of exposing the first surface of the substrate to a first plasma generated from a process gas containing a carbon oxide gas, to remove debris on the groove, while suppressing an increase in the variations in depth of the groove; and
a dicing step of exposing the substrate at a bottom of the groove to a second plasma after the cleaning step, to dice the substrate into element chips including the element regions.

2. The element chip manufacturing method of claim 1, further comprising a protective film forming step of covering the first surface with a protective film before the laser scribing step.

3. The element chip manufacturing method of claim 1, wherein the metal material is removed in the laser scribing step.

4. The element chip manufacturing method of claim 1, wherein the process gas further contains a fluorine-containing gas.

5. The element chip manufacturing method of claim 1, wherein the carbon oxide gas occupies 10 vol % or more of the process gas.

* * * * *